United States Patent
Sasaki et al.

[11] Patent Number: 5,998,313
[45] Date of Patent: Dec. 7, 1999

[54] CESIUM-LITHIUM BORATE CRYSTAL

[75] Inventors: Takatomo Sasaki; Yusuke Mori, both of Osaka, Japan

[73] Assignee: Japan Science and Technology Corporation, Saitama, Japan

[21] Appl. No.: 08/788,840

[22] Filed: Jan. 27, 1997

[51] Int. Cl.$^6$ .................................................. C01B 35/10
[52] U.S. Cl. .......................... 501/10; 423/277; 423/279
[58] Field of Search .............................. 501/10; 423/277, 423/279

[56] References Cited

U.S. PATENT DOCUMENTS 4,867,956  9/1989  Boryta et al. ............................. 423/281
5,104,845  4/1992  Montang et al. ......................... 502/202

FOREIGN PATENT DOCUMENTS 693581  1/1996  European Pat. Off. .

OTHER PUBLICATIONS

Tu, Jun–Ming et al, "CsLiB6010: A Noncentrosymmetric Poyborate," Materials Research Bulletin, vol. 30, No. 2, pp. 209–215, 1995.

*Primary Examiner*—Sean Vincent
*Attorney, Agent, or Firm*—Wenderoth, Lind & Ponack, L.L.P.

[57] ABSTRACT

A cesium-lithium borate crystal, of which the chemical composition is expressed by any of the following formulae:

$$Cs_{1-x}Li_{1-y}M_{x+y}B_6O_{10},$$

and $$Cs_{2(1-z)}Li_2L_zB_{12}O_{20}$$

(where, M is an alkali metal element, and L is an alkali earth element), and in which an exotic element is doped or annealed.

9 Claims, 2 Drawing Sheets

1cm

CESIUM-LITHIUM BORATE CRYSTAL

BACKGROUND OF THE INVENTION

1. Field of the Invention

The present invention relates to a cesium-lithium borate crystal. More particularly, the present invention relates to a cesium-lithium borate crystal which is useful as wavelength converting nonlinear optical crystal or the like for a laser oscillator or an optical parametric oscillator used in ultraviolet-ray lithography, laser fine processing and laser fusion and permits improvement of uniformity of refractive index, improvement of mecahnical, chemical and optical properties, and prevention of occurrence of cracks.

2. Description of the Related Art

In a conventional laser oscillator used in ultraviolet-ray lithography, laser fine processing or laser fusion, it is necessary to obtain stable ultraviolet rays efficiently, and wherein the a method of efficiently obtaining ultraviolet rays through wavelength conversion of a light source using a nonlinear optical crystal is attracting the general attention as a method for this purpose.

In a pulse YAG laser oscillator as a laser oscillator, the wavelength of a light source is converted with the use of a nonlinear optical crystal to generate triploid harmonic (wavelength: 355 nm) or tetraploid harmonic (wavelength: 266 nm).

Many contrivances have been made regarding a wavelength converting nonlinear optical crystal indispensable for generating ultraviolet rays. For example, crystals of such borates as betabarium metaborate ($\beta$-$BaB_2O_4$), lithium triborate ($LiB_3O_5$) and cesium triborate ($CsB_3O_5$) are known. Such a wavelength converting nonlinear optical crystal for generating ultraviolet rays permits transmission of a light having a wavelength of up to 200 nm, and has a high nonlinear optical constant However, in $\beta$-$BaB_2O_4$, one of such wavelength converting nonlinear optical crystals, easy occurrence of phase transition upon melt growth during the process of preparation makes it difficult for crystal growth to take place, and a narrow angular allowance leads to a low generality.

In $LiB_3O_5$ or $CsB_3O_5$, another of the wavelength converting nonlinear optical crystals, growing period is very long for flux growth during the process of manufacturing, and phase alignment is possible only for a light of a wavelength of up to about 555 nm. It is therefore applicable for the generation of triploid harmonic (wavelength: 355 nm) available by an Nd-YAG laser, for example, but is defective in that it is not applicable for the generation of tetraploid harmonic (wavelength: 266 nm).

Under these circumstances, the present inventors developed a novel cesium-lithium borate crystal, a high-performance wavelength converting nonlinear optical crystal, as a material capable of overcoming the defects in the conventional art, which permitted conversion of a light of a shorter wavelength through transmission, gave a high conversion efficiency, and had wide temperature allowance and angular allowance, and have proposed anew this crystal itself, a method of manufacturing the same and a method of utilizing the same (Japanese Provisional Patent Application JP-A-7-128698). This cesium-lithium borate crystal including composition-substituted crystals was clarified to be an epoch-making one, and is attracting the general attention as an optical material bringing about new developments.

As a result of studies carried out by the present inventors, in spite of its excellent properties, the cesium-lithium borate crystal is now known to have problems in that it tends to be deteriorated because of its hygroscopicity and water solubility, and in that residual processing distortion tends to cause cracks.

The present invention aims created to solve these problems and has an object to permit improvement of mechanical, chemical and optical properties of a cesium-lithium borate crystal, a high-performance wavelength converting nonlinear optical crystal, and composition-substituted crystals thereof, which can transmit a light of a shorter wavelength and convert the wavelength, have a high conversion efficiency and wide temperature allowance and angular allowance.

SUMMARY OF THE INVENTION

As means for solving the foregoing problems, the present invention provides a cesium-lithium borate crystal having a chemical composition expressed as $CsLiB6O10$ and wherein the cesium-lithium borate crystal is doped with an exotic element, or annealed.

The present invention provides also a crystal as a composition-substituted crystal of the above crystal, having a chemical composition expressed by the formula:

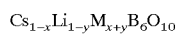

(wherein, M is at least one alkali metal element other than Cs or Li; $0 \leq x+y < 2$, $0 \leq x < 1$ and $0 \leq y < 1$) or,

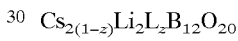

(wherein, L is at least one alkali earth metal element, and $0 < z < 1$) and wherein the crystal is doped with an exotic element, or annealed.

The present invention provides also embodiments of the foregoing crystal, wherein the crystal is doped with the exotic element and further annealed, wherein the exotic element for doping is a metal, a metalloid or a non-metallic (IV-group) element other than an alkali metal and an alkali earth metal, and wherein the exotic element is at least one selected from the group consisting of Al, Ge, Ti, Ga, C, Si, Sn, Zn, Cu Cd, Sb, Bi, V, Ta, Mo, W, Sb and P. The present invention provides another embodiments wherein the foregoing annealing is carried out preferably at a temperature of above 100° C.

DETAILED DESCRIPTION OF THE INVENTION

Figure 1:
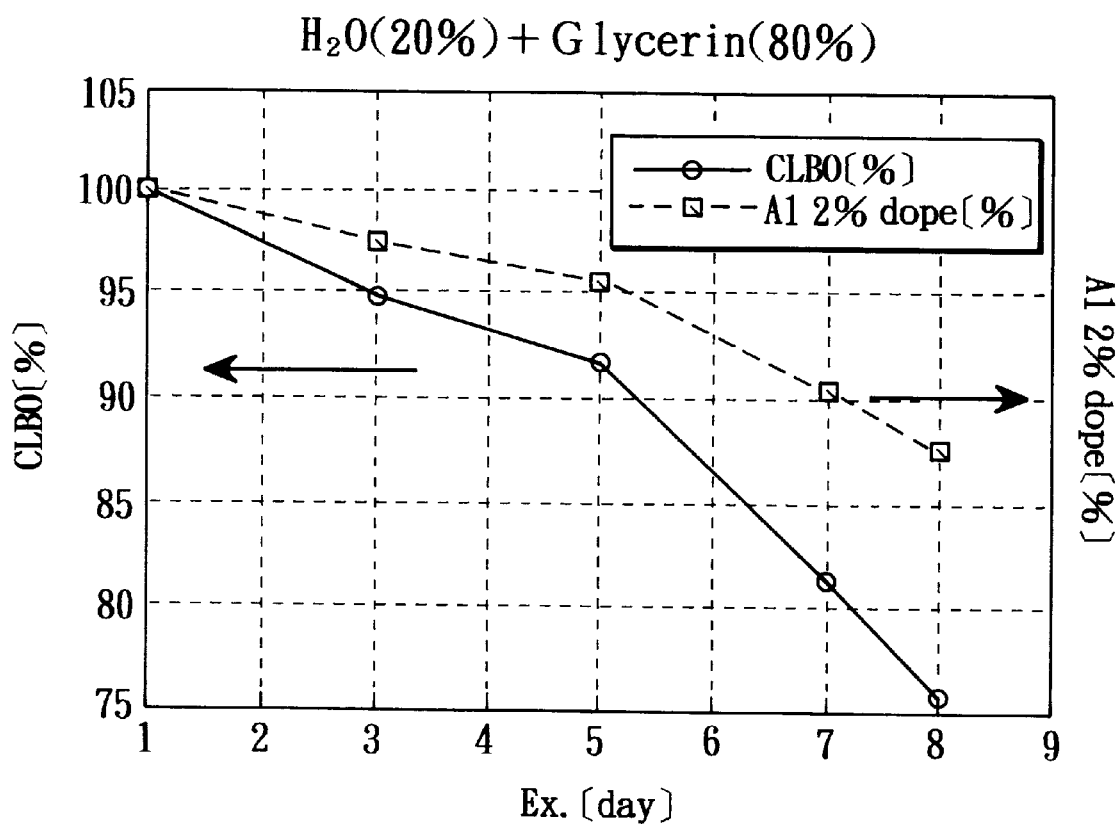
FIG. 1 shows a view illustrating the effect of Al dope.

The present inventors found the possibility of achieving a high-performance borate crystal so far unknown, in view of the fact that a crystal of a borate such as betabarium metaborate ($\beta$-$BaB_2O_4$), lithium triborate ($LiB_3O_5$) or cesium triborate ($CsB_3O_5$), commonly used as a wavelength converting nonlinear optical crystal conventionally for generating ultraviolet rays, was a borate crystal in general containing a single metal, by incorporating a plurality of kinds of metal ions.

More specifically, the present inventors prepared several kinds of borate crystals containing two or more kinds of metal ions of an alkali metal, an alkali earth metal and the like, and carried out an occurrence experiment of double harmonic (wavelength: 532 nm) by irradiating Nd-YAG laser (wavelength: 1,064 nm) onto these borate crystals, thereby searching for the most suitable combination of metals through these many experimental verifications.

As a result, as already proposed, the present inventors found very strong generation of second harmonic from borate crystals including both Cs and Li, and achieved quite a novel crystal in the form of the cesium-lithium borate crystal and a composition-substituted crystal thereof of the present invention.

The present inventors thus obtained new findings that, when doping an exotic element to the new cesium-lithium borate crystal (including a composition-substituted crystal thereof), occurrence of cracks caused by residual distortion and propagation thereof are effectively inhibited, water solubility is reduced, and water resistance is improved.

Doping of the exotic element to the crystal can be achieved through mixing of a metal, metalloid or non-metallic element as described above. For example, one or more selected from the group consisting of Al, Ge, Ti, Hf, Ga, C, Si, Sn, Zn, Cu, Cd, Sb, Bi, V, Ta, Mo, W, Sb, P, Fe, Ni and Co would be doped.

Doping of these elements is made possible through mixing of compounds such as oxides and carbonates during preparation of crystal.

The present inventors found also the possibility of largely improving optical and mechanical properties of this novel cesium-lithium borate crystal by annealing.

The cesium-lithium borate crystal tends to react to water or moisture in an air condition, and to residual processing distortion on the periphery of crystal. By these reasons, refractive index of the crystal is changed because of lattice constant of the crystal is transformed. By annealing it, however, non-uniformity of refractive index is reduced, leading to improvement of optical properties. Furthermore, reduction of residual distortion resulting from annealing inhibits occurrence of cracks.

Annealing can preferably be carried out by way of heating the crystal or keeping the crystal before using it at heating condition, in general at a temperature of at least 100° C. In case of heating it, annealing can be more preferably, at least 150° C. The preferable temperature range is from 150° C. to 450° C., or more preferably, from 250° C. to 350° C. On the other hand, in case of keeping it at heating condition, the crystal can be kept at the temperature of 100° C. to 130° C. Preferable atmosphere is the open air or an inert gas, in vacuum. There is no particular limitation on the equipment for annealing.

In the present invention, a prescribed crystal is prepared by heating and melting a raw material mixture of initial materials such as cesium carbonate ($Cs_2CO_3$), lithium carbonate ($Li_2CO_3$) and boron oxide ($B_2O_3$).

For a cesium-lithium borate crystal substituted with an alkali metal element or an alkali earth metal element (M) other than Cs or Li, the suitable composition range in terms of the preparation and physical properties is of the order of $0 < x \leq 0.01$ when the alkali metal element (M) is Na (sodium), $0 < x \leq 0.1$ when M is K (potassium), and $0 < x < 1$ when M is Rb (rubidium). A plurality of alkali metal elements may of course be added.

By adding these alkali metal ions, it is possible to change the refractive index of the crystal, thus permitting improvement of the phase alignment angle, the angular allowance and the temperature allowance. By achieving a structural change of crystal, furthermore, it is possible to obtain a more stable crystal harder to be broken or to become white-muddy. As the alkali earth metal (L), Ba, Sr, Ca and/or Mg ions may be added.

As in the addition of the alkali metal alone, it is possible to change refractive index of the crystal by adding an alkali earth metal ion, resulting in improvement of the phase alignment angle, angular allowance and temperature allowance. It is simultaneously possible to obtain a more stable crystal harder to be broken by giving a structural change of the crystal.

In a cesium-lithium borate crystal substituted with an alkali metal ion or an alkali earth metal ion in the present invention, an exotic element other than the various alkali metals and alkali earth metals as described above is doped.

The doping ratio in this case, varying with the kinds of elements and the composition of the crystal, may be determined in general with a range of from 0.1 to 10 mol % relative to the entire composition of the crystal as a standard. The doping brings about further improvement of physical, chemical and optical properties of the crystal.

Optical and mechanical properties of the cesium-lithium borate crystal substituted with the alkali metal ion or alkali earth metal ion are largely improved by annealing in the present invention.

Now, the present invention will be described further in detail by means of examples. It is needless to mention that the present invention is not limited by the following examples.

EXAMPLE 1

A cesium-lithium borate crystal ($CsLiB_6O_{10}$) comprising a stoichiometric composition was prepared by heating and melting a mixture of cesium carbonate ($Sc_2O_3$), lithium carbonate ($Li_2O_3$) and boron oxide ($B_2O_3$). The resultant cesium-lithium borate crystal was grown by the seeding method based on top seeding Cyprus process in a five-layer control growth furnace. The five-layer control growth furnace used for crystal growth had a construction in which a cylindrical platinum crucible was provided in a vertical type five-stage resistance heating furnace capable of keeping a uniform temperature within the furnace. In this cylindrical platinum crucible, seed grains of the cesium-lithium borate crystal of the stoichiometric composition were attached to a platinum wire serving as a nucleus for crystal growth. This seed crystal was rotated at a rate of 15 rotation per minute, and further, crystal growth was conducted while reversing the direction of rotation every three minutes, At this point, temperature in the platinum crucible was kept at 848° C. the melting point of the crystal. As a result, a transparent and high-quality cesium-lithium borate crystal free from cracks having a size of 2.9 cm×2.0 cm×2.2 cm could be grown in about four days. As compared with the conventional growth of a wavelength converting borate nonlinear optical crystal, this is a growth of a very short period of time. According to the growing method of the cesium-lithium borate crystal of the present invention, therefore, it is possible to grow a cesium-lithium borate crystal easily in a very short period of time.

As a result of a crystal structure analysis by means of an X-ray diffraction apparatus, the cesium-lithium borate crystal was found to be a tetragonal crystal falling under space group 142d symmetry group having a crystal lattice constant a=10.494 Å, c=8.939 Å, and a calculated density of 2.461 g/cm³. This cesium-lithium borate crystal has a three-dimensional structure in which a cesium atom is located in the channel of borate ring composed of boron and oxygen. This is quite a different structure from that of the nonlinear optical crystal LiB₃O₅ or CsB₃O₅ (both are orthorhombic crystals) conventionally used in common.

This cesium-lithium borate crystal transmitted, from the permeability spectrum, a light having a wavelength within a range of from 180 nm to 275 nm, and was transparent. The absorption edge is at 180 nm, which was shorter by about 9 nm as compared with that of the conventional BBO (189 nm).

It was however confirmed that this cesium-lithium borate crystal is hygroscopic when left in the open air for a long period of time. Because processing distortion remains in the crystal periphery and tends to propagate, optical and mechanical properties tend to deteriorate.

With this fact in view, therefore, Al₂O₃ was mixed in the process of preparation and growth as described above, thereby preparing an Al 12%-doped CLBO crystal to dope Al (aluminum) to this crystal (CLBO crystal) tending to have deteriorating properties.

An Al:CsLiB₆O₁₀ crystal was grown. This crystal had a structure in which Cs was substituted with Al, with a shorter a-axis and a longer c-axis.

FIG. 1 illustrates the result of study on water solubility reducing effect of this Al-doped crystal. A water (20%)/glycerine (80%) solution was used as a medium. The result suggests that, as compared with the non-doped CLBO crystal, water solubility of the 2% Al-doped crystal is remarkably reduced. There is observed a considerable improvement of water resistance. In the optical aspect, the phase alignment wavelength could be reduced.

EXAMPLE 2

Figure 2A:
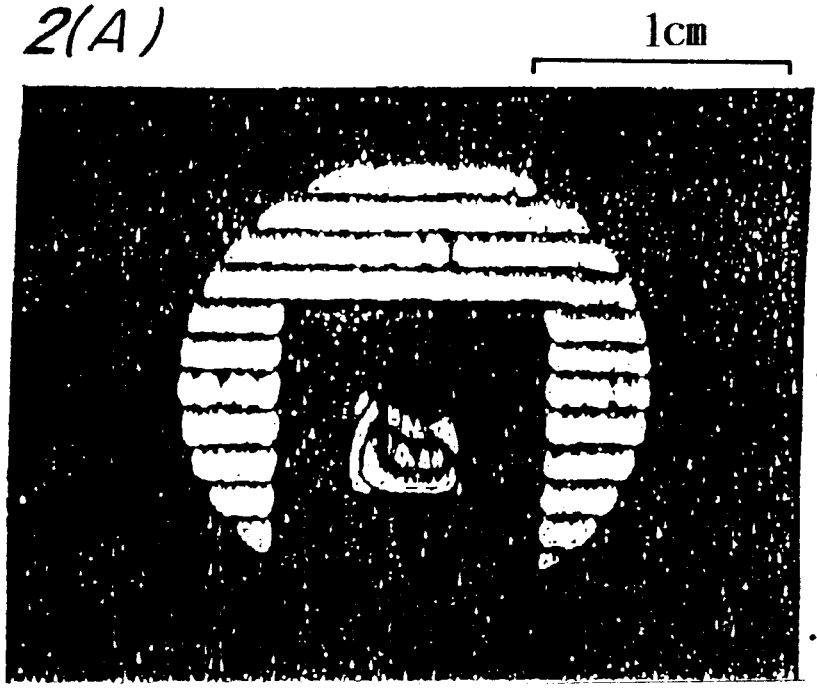
FIG. 2A compares a laser interference transmitted wave surface after holding in the open air for three months, and FIG. 2B compares a laser interference transmitted wave surface after heat treatment at 300° C. for three hours.
Figure 2B:
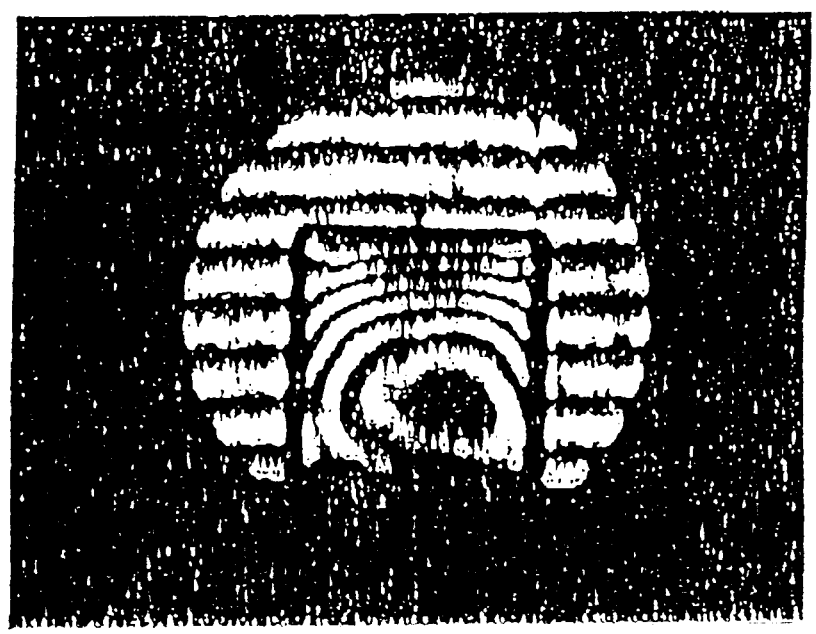
FIG. 2 shows microphotographs illustrating comparison of laser interference transmitted wave surfaces.

The crystal (CLBO crystal) described in the Example 1 tending to have deteriorating properties was annealed in the open air at a temperature of 300° C. for three hours. The result revealed that annealing eliminated processing distortion, achieved a uniform refractive index, improved optical properties, and inhibited occurrence of cracks. FIG. 2A compares a laser interference transmitted wave surface after holding in the open air for three months and FIG. 2B compares a laser interference transmitted wave surface after heat treatment at 300° C. for three hours. FIG. 2 also suggests that the effect of annealing is excellent.

EXAMPLE 3

The crystal (CLBO) described in the Example 1 was kept at the condition of temperature of 105° C. for 6 months in a air atmosphere.

A refractive index and optical properties are improved. This result also suggests that the effect of annealing is excellent.

EXAMPLE 4

In the same manner as in Example 1, Al and Ga were doped into CLBO crystals as shown in Table 1 to evaluate Vickers hardness. The result is shown also in Table 1.

The result suggests that, as compared with the CLBO crystal not doped with impurities, mechanical property values are improved, and cracks are prevented.

TABLE 1

|  | Vickers hardness (surface a) | Vickers hardness (surface c) |
| --- | --- | --- |
| CLBO | 270 | 180 |
| 1% Al-doped CLBO | 300 | 220 |
| 5% Al-doped CLBO | 310 | 230 |
| 1% Ga-doped CLBO | 270 | 220 |

EXAMPLE 5

In the same manner as in Example 1, an Rb (rubidium)-substituted cesium-lithium crystal $Cs_{1-x}LiRb_xB_6O_{10}$ was prepared.

According to the result of evaluation of the resultant crystal by the powder X-ray diffraction method, sequential increase in the amount of Rb from x=0.2 to 0.5 and then 0.7 starting from the X-ray diffraction pattern of a sample (Rb, x=0) not added with Rb leads to gradual decrease in angular interval between reflection of the plane (312) and that of the plane (213). This suggests that Cs and Rb enter the crystal at an arbitrary ratio. The crystal arbitrarily added with Rb has the same shape of crystal of a tetragonal crystal as that of CLBO not added with Rb, and tendency of change in lattice constant is observed.

It is clear from this that, because Rb ion can be added in an arbitrary amount, it is possible to modify refractive index of the crystal, and to improve the phase alignment angle, angular allowance or temperature allowance.

Similarly crystals with an amount (x) of added Rb of under 0.1. A better structural stability of crystal was confirmed.

For this crystal as well, the effect of Al doping and the effect of 2-hour annealing at a temperature of 320° C. were examined, and the same excellent effects as in Examples 1 and 2 were confirmed. This confirms also improvement of optical and mechanical properties.

According to the present invention, as described above in detail, it is possible to improve optical properties through achievement of a more uniform refractive index, thus making it possible to obtain a cesium-lithium borate crystal in which occurrence of cracks is inhibited and water resistance is improved.

What is claimed is:

1. A cesium-lithium borate crystal having a chemical composition expressed by the following formula:

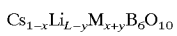
$$Cs_{1-x}Li_{L-y}M_{x+y}B_6O_{10}$$

wherein M represents at least one alkali metal element other than Cs and Li, 0<x+y<2, 0≦x<1 and 0≦y<1, and wherein the crystal is doped with an element, or is annealed.

2. A cesium-lithium borate crystal having a chemical composition expressed by the following formula:

$$Cs_{2(1-z)}Li_2L_2B_{12}O_{20}$$

wherein L represents at least one alkali earth metal element, and 0<z<1, and wherein the crystal is doped with an element, or is annealed.

3. A cesium-lithium borate crystal having a chemical composition expressed by the following formula:

$$CsLiB_6O_{10},$$

wherein the crystal is annealed, or wherein the crystal is doped with an element in an amount above naturally occurring impurities and sufficient to inhibit occurrence of cracks in the crystal and improve water resistance of the crystal.

4. The cesium-lithium borate crystal according to claim 1, 2 or 3, wherein the crystal is doped and annealed.

5. The cesium-lithium borate crystal according to claim 1, 2 or 3, wherein said element is a metal other than an alkali metal or an alkali earth metal, a metalloid or a non-metallic element.

6. The cesium-lithium borate crystal according to claim 1, 2 or 3, wherein said element is at least one selected from the group consisting of Al, Ge, Ti, C, Si, Ga, Sn, Cu, Cd, Sb, Bi, V, Ta, Mo, W, Sb and P.

7. The cesium-lithium borate crystal according to claim 1, 2 or 3, wherein said crystal is annealed at a temperature above 100° C.

8. The cesium-lithium borate crystal according to claim 7, wherein said crystal is heated at a temperature within a range of from 250 to 350° C. for a period of time within a range of from 30 minutes to five hours.

9. The cesium-Lithium borate crystal according to claim 7, wherein said crystal is kept at a temperature of from 100° C. to 130° C.

\* \* \* \* \*